United States Patent
Fwu

(10) Patent No.: US 6,512,470 B2
(45) Date of Patent: Jan. 28, 2003

(54) METHOD OF VOLTAGE CONTROLLED OSCILLATOR DIGITAL/ANALOG CONVERTED VALUE ADJUSTMENT OF COMPACT DISK READ ONLY MEMORY DEVICE

(75) Inventor: Hsiang Yi Fwu, Taipei (TW)

(73) Assignee: Lite-On It Corp., Taipei (TW)

( * ) Notice: Subject to any disclaimer, the term of this patent is extended or adjusted under 35 U.S.C. 154(b) by 0 days.

(21) Appl. No.: 09/754,059

(22) Filed: Jan. 5, 2001

(65) Prior Publication Data

US 2002/0089438 A1 Jul. 11, 2002

(51) Int. Cl.[7] .............................. H03M 1/06; H03D 3/24
(52) U.S. Cl. ........................................ 341/118; 375/376
(58) Field of Search ................................. 341/110, 139, 341/142, 155, 161, 118, 120; 375/376; 331/1, 11; 360/31, 32; 332/117; 327/156

(56) References Cited

U.S. PATENT DOCUMENTS 5,005,016 A * 4/1991 Schmidt et al. .............. 341/142
5,483,203 A * 1/1996 Rottinghaus .................... 331/1
5,760,982 A * 6/1998 Stein ............................ 360/31
5,796,358 A * 8/1998 Shih et al. ................... 341/139

* cited by examiner

Primary Examiner—Patrick Wamsley
(74) Attorney, Agent, or Firm—Rosenberg, Klein & Lee

(57) ABSTRACT

A method of VCODAC adjustment of speed is disclosed. Values of a VCO digital/analog converter (VCODAC) generator according to the frequency of every speed are estimated at first, and then an output of a loop filter is used to on-line adjust the value to an optimum value. As the pick up head reads the same position, it need not be adjusted again. The reading ability of an optical disk drive is improved.

1 Claim, 2 Drawing Sheets

METHOD OF VOLTAGE CONTROLLED OSCILLATOR DIGITAL/ANALOG CONVERTED VALUE ADJUSTMENT OF COMPACT DISK READ ONLY MEMORY DEVICE

FIELD OF THE INVENTION

The present invention relates to a method of voltage controlled oscillator on-line tuning for every speed to a central oscillating frequency of an voltage controlled oscillator (VCO) to be near a value to be locked.

BACKGROUND OF THE INVENTION

The speed of a Compact Disk Read Only Memory (CD-ROM) device is controlled by a spindle motor. As the data is desired to be read out, the data phase lock loop (data PLL) should extract the channel basic clock out of the EFM signal. In general, a phase lock loop serves to lock the phase of the EFM signal so that the terminal may receive the data read from the pick up head synchronously.

Generally, when the CD-ROM drive estimates the VCO-DAC according to the frequency of every speed, it is set a proper VCO digital/analog converter (VCODAC) value. Therefore, the VCODAC value at each speed is determined when VCODAC calibration done.

However, the inaccuracy calibration will effect the CD-ROM drive so as not to lock the frequency of a data to be locked due to a too high voltage or a too low voltage of the VCO input, and thus it is failure when reading the data.

SUMMARY OF THE INVENTION

Accordingly, the primary object of the present invention is to provide method of VCODAC adjustment of speed, wherein by an analog/digital converter to read the output value of the loop filter, the VCODAC value can be adjusted in time.

A further object of the present invention is to provide a method of VCODAC adjustment of speed, wherein as the pick up head reads the same position, it is unnecessary to be adjusted again. The reading ability of an optical disk drive is improved.

A further object of the present invention is to provide a method of VCODAC adjustment of speed, wherein as the pick up head reads the same position, it is needless to be adjusted again. The reading ability of an optic disk drive is improved.

The various objects and advantages of the present invention will be more readily understood from the following detailed description when reading in conjunction with the appended drawing.

DETAILED DESCRIPTION OF THE PREFERRED EMBODIMENTS

Figure 1:
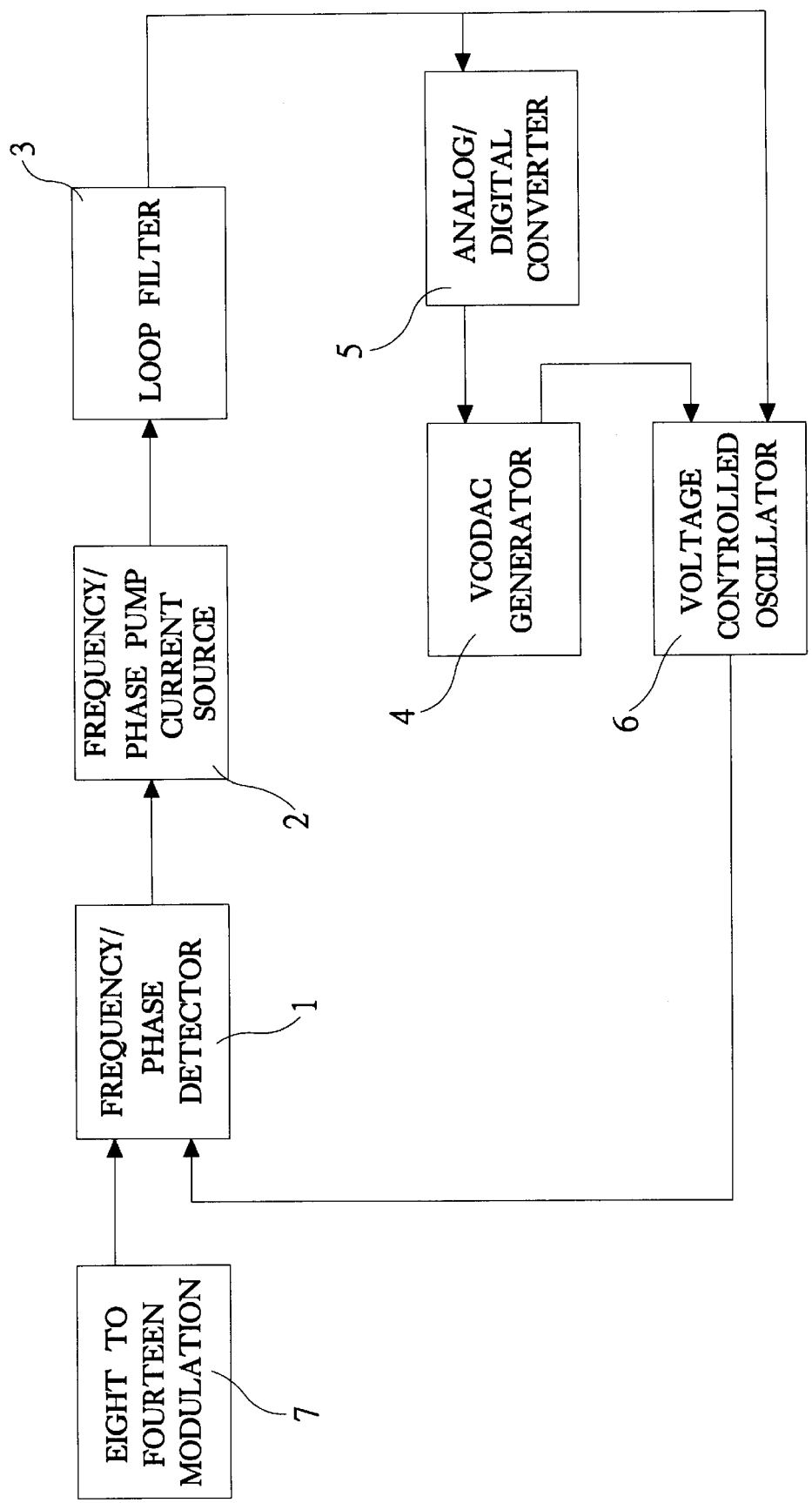
FIG. 1 is a circuit block diagram of the data phase lock loop of the present invention.

With reference to FIG. 1, the circuit block diagram of the data phase lock loop is illustrated. The circuit includes a frequency/phase detector 1, a frequency/phase pump current source 2, a loop filter 3, a VCO digital/analog converter 4, an analog/digital converter 5 and a voltage controlled oscillator 6.

The frequency/phase detector 1 has an input connected to an eight to fourteen modulation (EFM) system 7. The output of the frequency/phase detector 1 is connected to the frequency/phase pump current source 2, the frequency/phase pump current source 2 has an output connected to the loop filter 3. The output of the loop filter 3 is connected to the voltage controlled oscillator 6. The output of the voltage controlled oscillator 6 is connected to the frequency/phase detector 1. The voltage controlled oscillator 6 is connected to the VCODAC generator 4. The analog/digital converter 5 is connected between the VCODAC generator 4 and the loop filter 3. The analog/digital converter 5 reads the voltage value of the output of the loop filter 3 and then converts the output to a digital voltage value, then transfers the digital voltage value to the VCODAC generator 4 and adjusts the VCODAC value.

The frequency range of the voltage controlled oscillator 6 was controlled by the VCODAC value outputted from the VCODAC generator 4 and the output value of the loop filter 3, thus further adjusts the VCODAC value is used.

If the output of the loop filter 3 is too high, the VCODAC value increases. On the contrary, if the output of the loop filter 3 is too low, the VCODAC value decreases.

Figure 2:
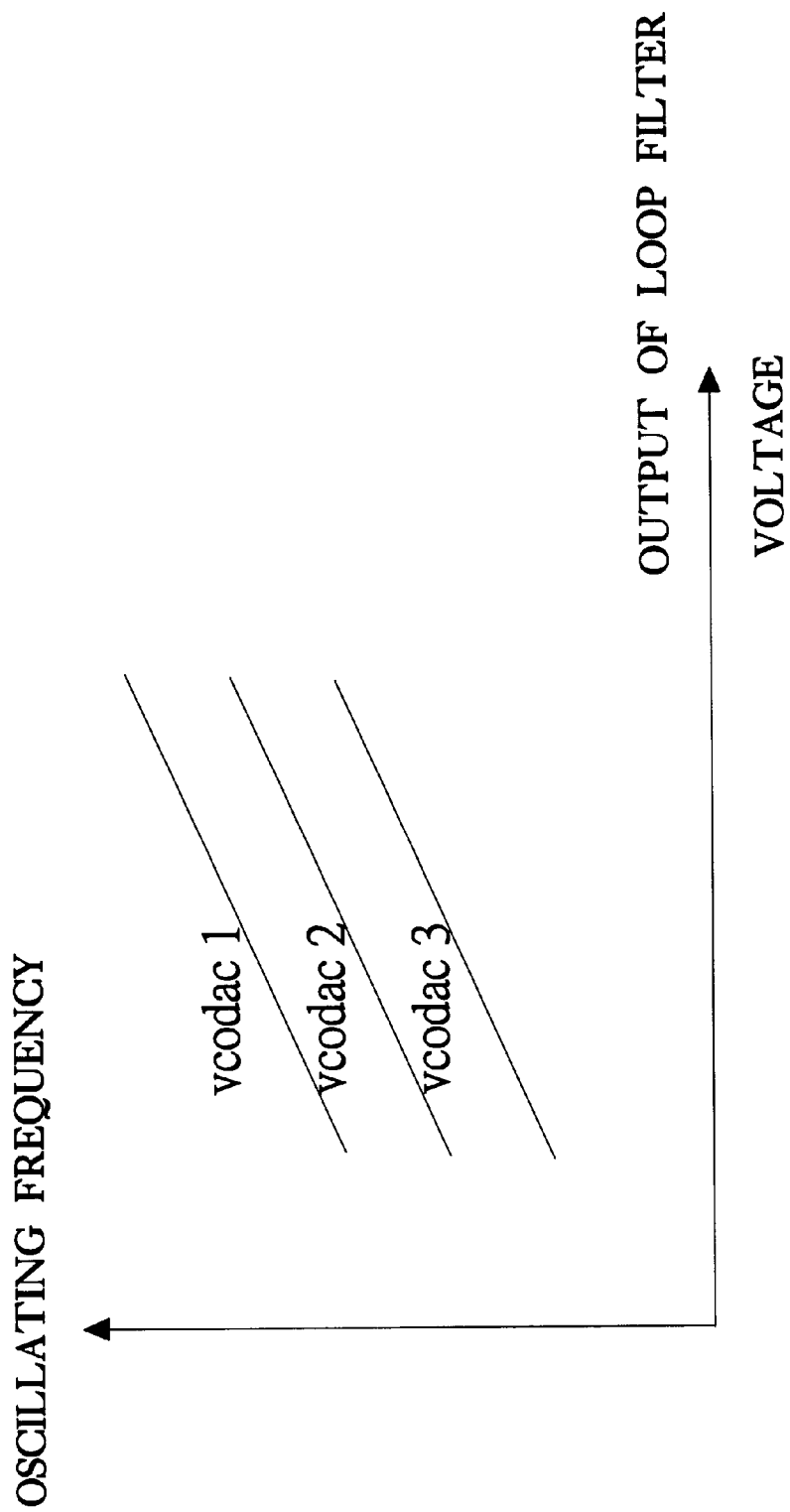
FIG. 2 shows the relation between the output of the loop filter to the oscillating frequency under different VCODAC value.

Referring to FIG. 2, it shows the relation between the output of the loop filter to the oscillating frequency under different VCODAC value. It is appreciates that as the output of the loop filter 3 is too high, the VCODAC value increases. On the contrary, if the output of the loop filter 3 is too low, the VCODAC value decreases.

After the CD-ROM drive estimated the VCODAC value according to the frequency of every speed during VCODAC calibration, by the method of the present invention, it is adjusted to an optimum VCODAC value so that central oscillating frequency of the VCO is near the frequency to be locked. After the adjustment is accomplished, the new VCODAC value serves to replace the correct value.

Therefore, the problem that afterwards the pick up head reads the same position, it does not need to adjust again and improve the reading ability of a CD-ROM drive.

In summary, the adjustment of the present invention has the following advantages:

(1) By an analog/digital converter to read the output value of the loop filter, the VCODAC value can be adjusted in time.

(2) The central oscillating frequency of the VCO is near a frequency of the data to be locked without the failure condition of reading the data.

(3) As the pick up head reads the same position, it is needless to be adjusted again. The reading ability of a CD-ROM drive is improved.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method of adjusting a frequency range of a voltage controlled oscillator in a data phase locked loop for reading data from an optical disk, the method comprising the steps of:

a. providing a voltage controlled oscillator having a first input for receiving a first voltage signal corresponding to a frequency range of all output signal of the voltage controlled oscillator and a second input for receiving a second voltage corresponding, to an offset frequency value for adjusting a frequency of said output signal within said frequency range;

b. providing a frequency/phase detector and coupling a first input thereof to a data signal output from an eight-to-fourteen modulation system of the optical disk, a second input of said frequency/phase detector being coupled to said output signal of said voltage controlled oscillator for comparison with said data signal;

c. providing a loop filter having an input coupled to an output of said frequency/phase detector and an output of said loop filter being coupled to said second input of said voltage controlled oscillator for providing said second voltage signal thereto;

d. providing an analog-to-digital converter having an input coupled to said output of said loop filter, said analog-to-digital converter providing a digital representation of said second voltage signal; and, e. providing a VCODAC generator having an output coupled to said first input of said voltage controlled oscillator to provide said first voltage signal thereto, said first voltage signal having a predetermined initial value corresponding to an approximate locking frequency of the data phase locked loop, said VCODAC generator having an input coupled to an output of said analog-to-digital converter for adjusting said first voltage signal at said output of said VCODAC generator responsive to variation of said second voltage signal.

* * * * *